United States Patent [19]

Summe

[11] Patent Number: 5,164,611
[45] Date of Patent: Nov. 17, 1992

[54] LOW NOISE COMMUNICATION BUS DRIVER

[75] Inventor: Richard A. Summe, Kokomo, Ind.

[73] Assignee: Delco Electronics Corporation, Kokomo, Ind.

[21] Appl. No.: 599,532

[22] Filed: Oct. 18, 1990

[51] Int. Cl.$^5$ .................. H03K 5/00; H03K 5/12; H06F 7/566; G06G 7/24
[52] U.S. Cl. .................. 307/261; 307/268; 307/263; 307/492; 328/145
[58] Field of Search ............... 307/443, 260, 261, 263, 307/491, 490, 494, 495, 268, 270; 375/60, 36; 178/69 N, 63 E; 328/27, 164, 145, 185

[56] References Cited

U.S. PATENT DOCUMENTS

| | | | |
|---|---|---|---|
| 4,327,249 | 4/1982 | Rademaker | 375/60 |
| 4,437,021 | 3/1984 | Sumi et al. | 375/36 |
| 4,593,206 | 6/1986 | Neidorff et al. | 307/263 |
| 4,896,333 | 1/1990 | Can | 375/36 |
| 4,947,058 | 8/1990 | Yarbrough et al. | 307/443 |
| 4,987,324 | 1/1991 | Wong et al. | 307/270 |
| 5,028,818 | 7/1991 | Go Ang et al. | 307/443 |

Primary Examiner—Janice A. Howell
Assistant Examiner—Sinh Tran
Attorney, Agent, or Firm—A. Frank Duke

[57] ABSTRACT

This invention relates to a waveshaping circuit for producing a bus output voltage signal having a substantially sinusoidal rising transition from a low voltage level to a high voltage level in response to the rising edge of a data input signal, and a substantially sinusoidal falling transition from said high voltage level to said low voltage level, in response to the falling edge of said data input signal. The circuit uses AC coupling to control the waveshaping. This allows the circuit to operate with a large ground offset voltage difference between circuit ground and bus ground. An exponential current source provides a current to a regulator bus driver which charges and discharges a capacitor in response to the the rising edge or falling edge on the data input signal. The current increases exponentially in response to the rising or falling edge on the data input signal and then decreasing exponentially when the bus output signal reaches one-half of its intended full voltage swing or falls below one-half the full voltage swing to respectively produce the sinusoidal rising and falling voltage at the bus output. The regulator bus driver regulates the voltage at the bus output when the voltage reaches the intended full voltage. The regulator bus driver circuit creates it own regulated high voltage level over supply variations from 9–16 volts.

11 Claims, 6 Drawing Sheets

LOW NOISE COMMUNICATION BUS DRIVER

FIELD OF THE INVENTION

This invention relates to pulse shaping circuits and more particularly to a low noise communication bus driver circuit for providing an output voltage waveform having sinusoidal rising and falling edges in response to input logic signals.

BACKGROUND OF THE INVENTION

A number of circuits have been developed for the purpose of driving a serial data bus without distorting the data contained in the logic input signals while eliminating high frequency noise components associated with the substantially instantaneous rise and fall times of the leading and trailing edges of the logic signals. One such circuit is disclosed in the patent to Neidorff et al U.S. Pat. No. 4,593,206. The patented circuit provides symmetrical rising and falling edges which have a predetermined slope. This circuit does not meet the stringent requirement of noise reduction, ground offset and propagation delay of anticipated motor vehicle communication buses.

SUMMARY OF THE INVENTION

With the foregoing in mind, it is an object of the present invention to provide a waveshaping circuit that generates a relatively small amount of noise in the AM broadcasting band.

It is another object of the present invention to provide a waveshaping circuit which is insensitive to ground offsets.

It is another object of the present invention to provide a waveshaping circuit which operates with a delay of less than twenty microseconds from the time the input goes high to the time the bus reaches a recognized high state.

BRIEF DESCRIPTION OF THE DRAWINGS

The above and other objects and advantages of the invention will become more apparent from the following description taken in conjunction with the accompanying drawings wherein like references refer to like parts and wherein.

Figure 1:
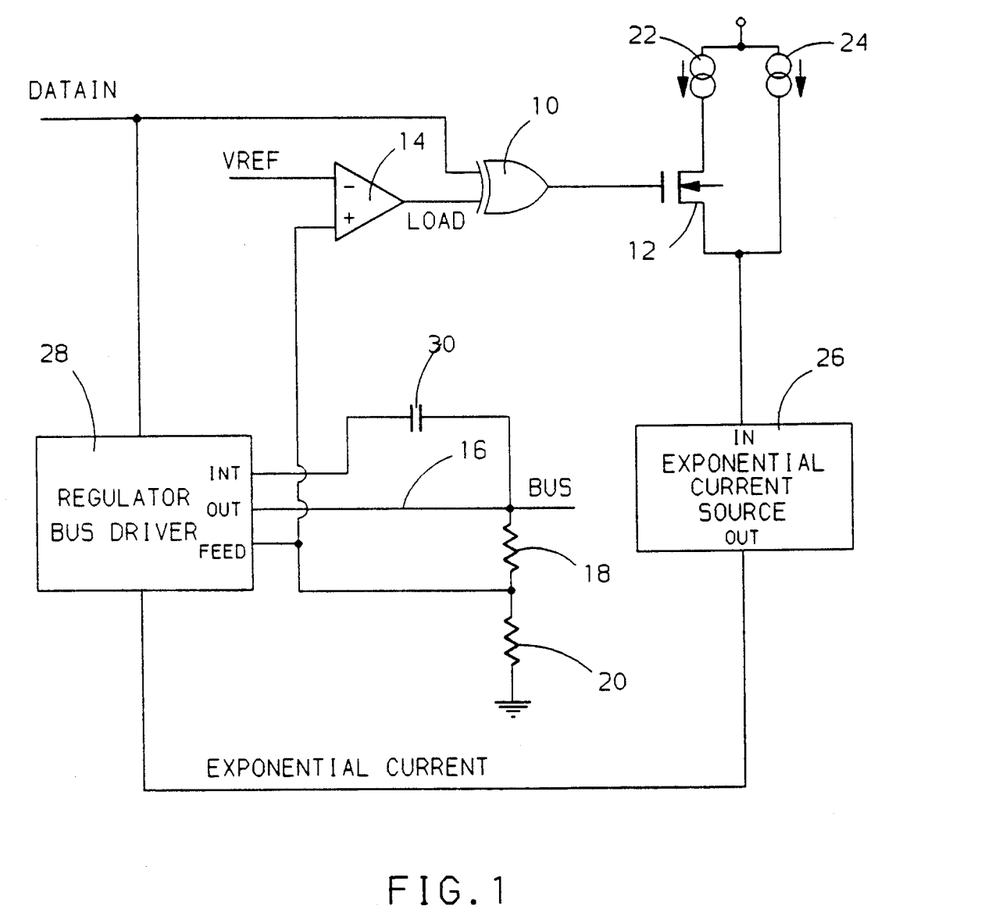
FIG. 1 is a block diagram of the invention.

Referring now to the drawings and initially to FIG. 1, a logic level drive signal designated DATAIN is applied as one input to an Exclusive OR gate 10 which controls the gate electrode of a NMOS transistor 12. The other input to the gate 10 is designated LOAD and is obtained from the output of a comparator 14. The comparator 14 switches when the output voltage on the bus 16 reaches one half of it's maximum intended value. The switch point is established by the voltage divider resistors 18 and 20. The transistor 12 is connected in series with and controls a current source 22 which provides 95 microamps of current. A current source 24 which provides 5 microamps of current is connected in parallel with the series connected transistor 12 and source 22.

An exponential current source 26 is serially connected with the parallel branches containing the sources 22 and 24 and thus receives 5 microamps when the transistor 12 is off and 100 microamps when the transistor 12 is on. The exponential current source 26 supplies current to a regulator/bus driver block 28 which also responds to DATAIN. The driver block 28 integrates the current from the source 26 via a capacitor 30, and provides an output voltage waveform on the bus 16. The output designated BUS has substantially sinusoidal leading and trailing edges in response to the substantially instantaneous rising and falling edges of the DATAIN logic drive signal as shown in FIG. 2.

Figure 2:
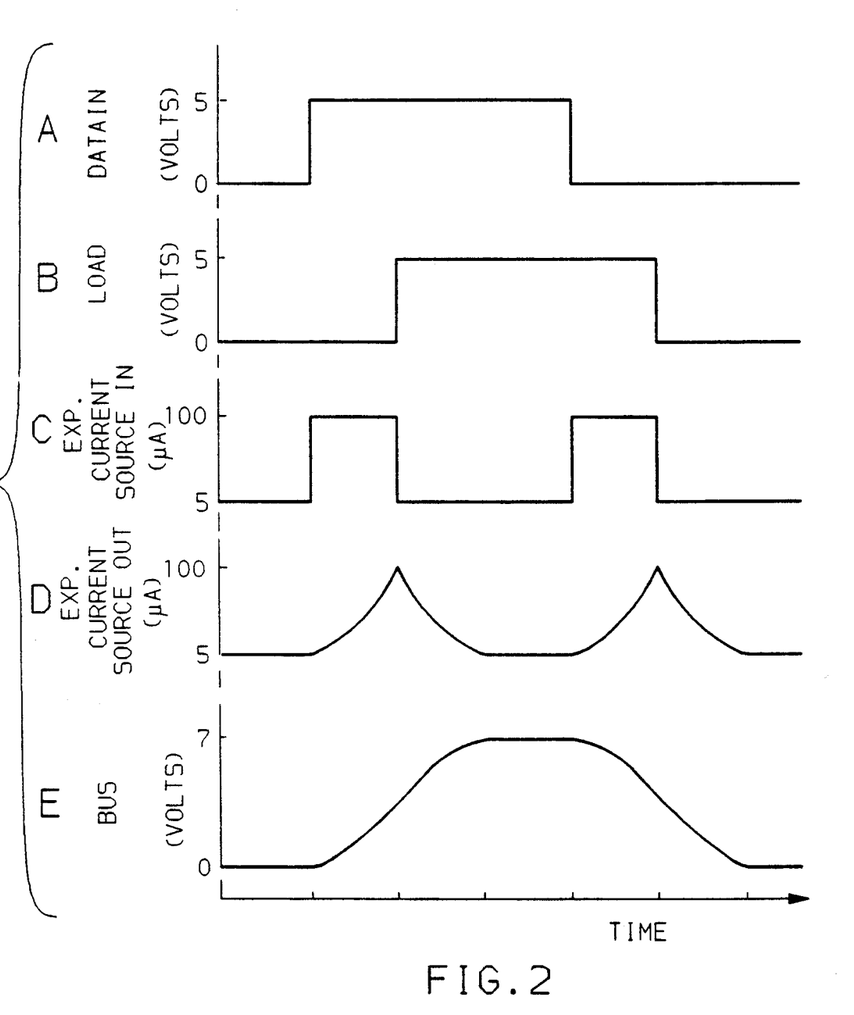
FIG. 2 shows various waveforms that are helpful in understanding the invention.

It will be noted in FIG. 2 that when DATAIN switches high while LOAD is low, the output of the gate 10 goes high turning on the transistor 12. Thus, the input to the exponential current source 26 is switched from 5 microamps to 100 microamps and the output of the current source 26 begins to rise exponentially. The current out of the source 26 is integrated by the capacitor 30 to produce the rising edge of the voltage waveform BUS (FIG. 2e). When the output of the driver 28 reaches midsupply, in the example shown 3.5 volts, the output of comparator 14 switches high. With both inputs to the gate 10 being high the output goes low turning off transistor 12. The input to the source 26 drops to 5 microamps and the output of the source 26 starts to decrease exponentially toward 5 microamps. The integration of the output of the source 26 continues but at a reduced rate, creating a voltage waveform on BUS which is shaped like a sinusoid. The same shaping occurs on the falling edge of DATAIN producing a falling edge shaped like a sinusoid. These sinusoidal rising and falling edges generate relatively small amounts of harmonic noise.

Figure 3:
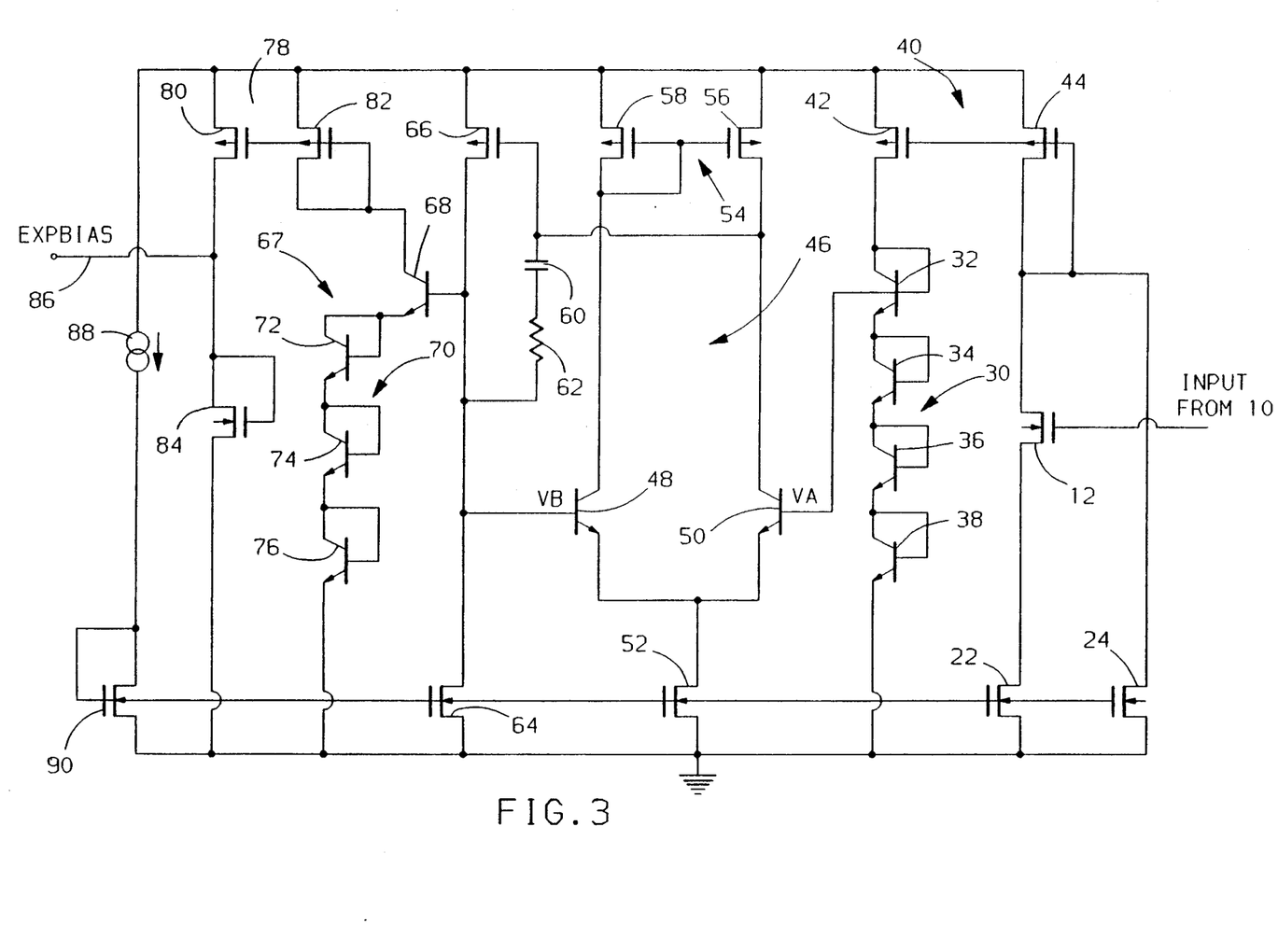
FIG. 3 is a detailed schematic diagram of the exponential current source of FIG. 1.

Referring now to FIG. 3 the exponential current source 26 is shown to include NMOS transistors 22 and 24 which function as the current sources 22 and 24 of FIG. 1. PMOS transistors 42 and 44 function as a current mirror. The NMOS transistor 12 acts as a switch as previously indicated. A diode string 31 includes diode connected NPN transistors 32-38 connected between the transistor 42 and ground.

A two stage operational amplifier 46, comprises a first stage including NPN input transistors 48 and 50, PMOS load transistors 56 and 58, and current source 52. The second stage includes PMOS drive transistor 66 and current source load 64. An integrating capacitor 60 and a zero canceling resistor 62 are connected between the collector of transistor 50 and the base of transistor 48.

A linear to exponential converter generally designated 67 comprises a transistor 68 and a diode string 70 which includes diode connected NPN transistors 72-76. The transistor 68 converts the linearly changing voltage designated VB, at it's base, into an exponentially changing current at it's collector. A current mirror comprising PMOS transistors 80 and 82 is connected with the transistor 68. A bias string reference comprising an NMOS transistor 84 converts the current from PMOS transistor 82 into a reference voltage for biasing other NMOS transistors in the bus driver 28 connected with conductor 86. A current source 88 is connected with a diode connected NMOS transistor 90 and sets up the bias voltages for the current sources 22, 24, 52 and 64.

Figure 4:
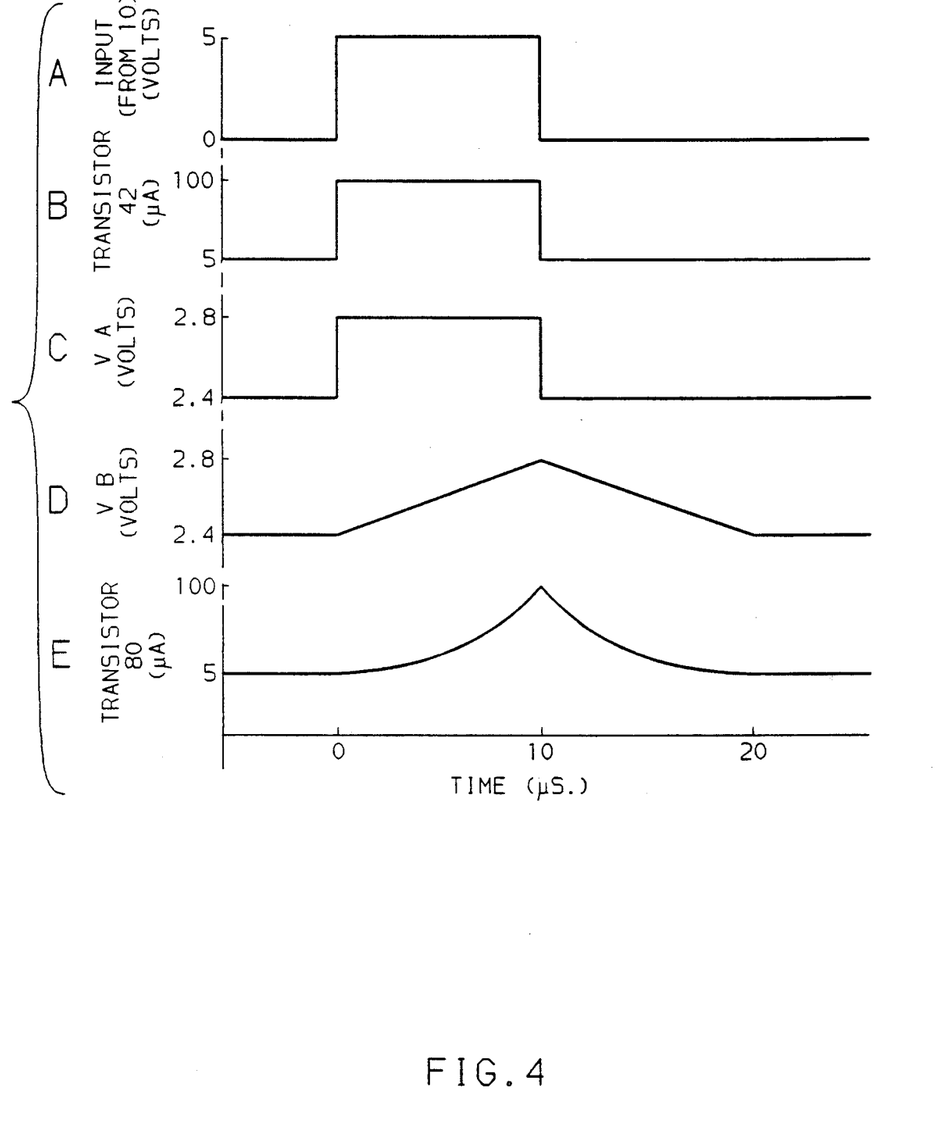
FIG. 4 shows various waveforms that are helpful in understanding the current source of FIG. 3.

The exponential current source 26 operates in the following manner with reference to the circuit of FIG. 3 and the waveforms of FIG. 4. When INPUT is low, the transistor 12 is turned off. Therefore the current sourced from transistor 44 is limited to the current being sunk by transistor 24 which in this example is 5 microamps. The current in transistor 44 is reflected to transistor 42 and flows through diode string 31 creating a reference voltage at node VA. In a steady state condition, the voltage at node VA is recreated at node VB by the two stage operational amplifier 46.

The voltage at node VB is converted back into a current by the linear to exponential converter 67. The current from the linear to exponential converter 67 is sourced from transistor 82 which in turn is reflected to transistor 80. The current from transistor 80 is converted to a bias reference voltage designated EXPBIAS by transistor 84 and applied to the regulator/bus driver via conductor 86.

When INPUT goes high (FIG. 4a), the transistor 12 turns on and the current sourced from transistor 44 is the current sunk by transistors 22 and 24 which totals 100 microamps. This current is reflected by transistor 42 into the diode string 31 which causes the voltage at node VA to change immediately to a higher value (FIGS. 4b and 4c). The amplifier 46 tries to change the voltage at node VB to match the voltage at node VA. However the voltage change at node VB is controlled by the discharging of capacitor 60.

Since node voltage VB is lower than node voltage VA, the transistor 50 conducts all of the current being sunk by transistor 52. The current from transistor 50 is used to discharge capacitor 60. The rate of discharge is controlled by the size of the capacitor 60 and the size of the current source transistor 52. This linearly discharging capacitor creates a linearly increasing voltage at node VB (FIG. 4d). The linearly increasing voltage at node VB, when applied to the linear to exponential converter 67 creates an exponentially increasing current (FIG. 4e).

The linear to exponential converter 67 operates in the following manner. The voltage at node VB induces a current in transistor 68 which is equal to: $I = Is * \exp VB/4*Vt$ Where I is the current flow in transistor 68, Is is the saturation current of the transistor 68 which is a constant for a given process, VB is the node voltage VB, Vt is the thermal voltage which is a constant at a given temperature. This current is sourced from the collector of transistor 68. A linearly increasing voltage at node VB causes an exponentially increasing current at the collector of transistor 68. The current from the collector of transistor 68 is reflected by the current mirror 78 to the transistor 84 to create the bias reference voltage EXPBIAS.

When INPUT goes low, the transistor 12 turns off and the current sourced from transistor 44 is reflected into the diode string which causes the voltage at node VA to change immediately to a lower value. The amplifier 46 tries to change the voltage at node VB to match the voltage at node VA. However the voltage change at node VB is controlled by the charging of capacitor 60.

Since node voltage VB is higher than node voltage VA, the transistor 48 conducts all of the current being sunk by transistor 52. The current from transistor 48 is sourced from load transistor 56. The current sourced from load transistor 58 is reflected to load transistor 56. The current from load transistor 56 is used to charge capacitor 60. The rate of charge is controlled by the size of the capacitor 60 and the size of the current source transistor 52. This linearly charging capacitor creates a linearly decreasing voltage at node VB. The linearly decreasing voltage at node VB, when applied to the linear to exponential converter 67 creates an exponentially decreasing current at the collector of transistor 68.

The current from the collector of transistor 68 is reflected by the current mirror to the transistor 84 to create the bias reference voltage EXPBIAS applied to the conductor 86.

Figure 5:
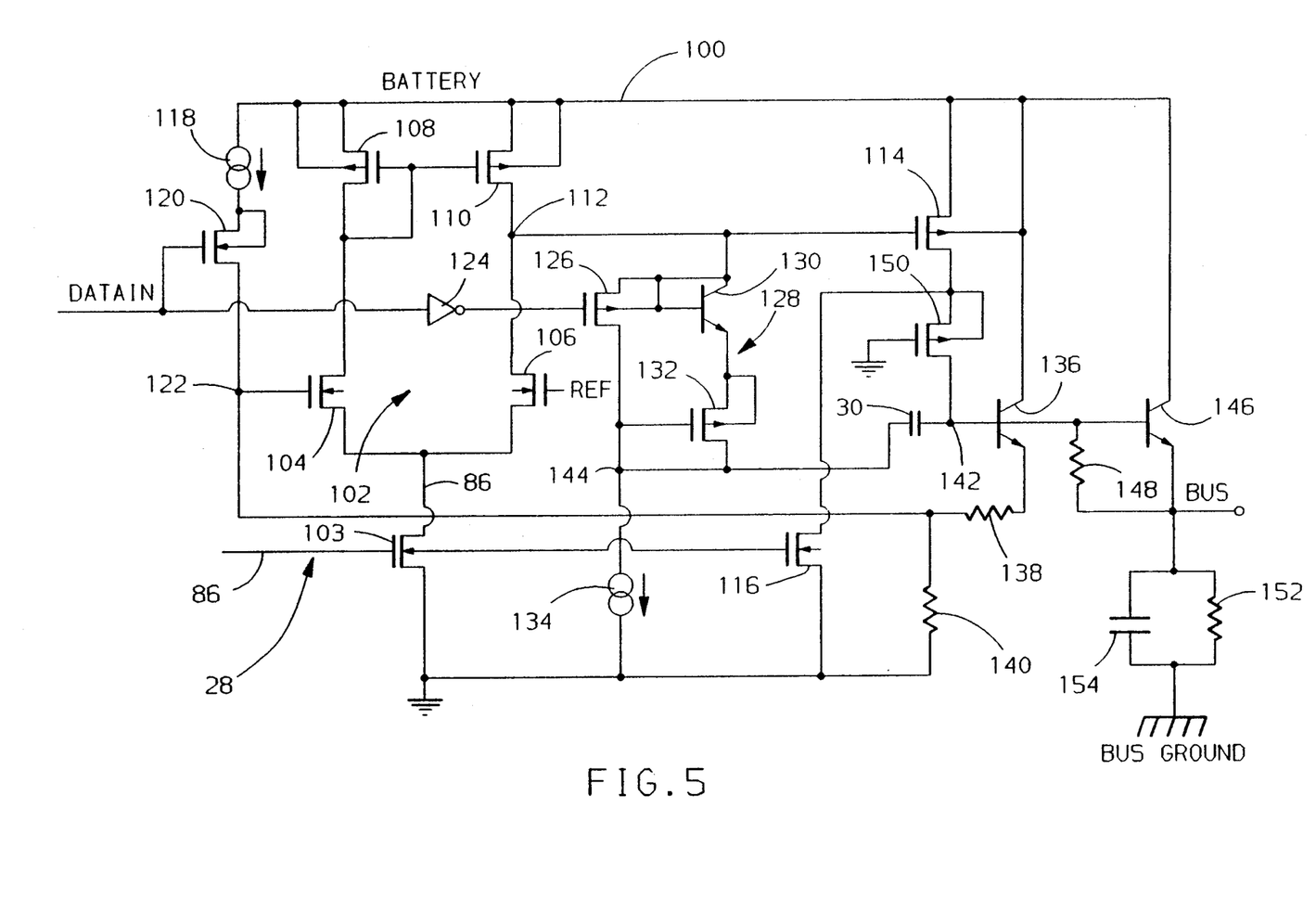
FIG. 5 is a detailed schematic diagram of the regulator bus driver of FIG. 1.

Referring now to FIG. 5, a detailed schematic of the regulator bus driver 28 is shown. The regulator bus driver is connected between a supply line 100 designated BATTERY and ground and includes a first subsection comprising a two stage differential amplifier generally designated 102 which is connected with an NMOS transistor current source 103 controlled by the exponential current source 26 via conductor 86. The amplifier 102 includes a first stage comprising NMOS input transistors 104 and 106, and PMOS load transistors 108 and 110. The second stage is connected with the output of the first stage at node 112 and includes a PMOS drive transistor 114 and a current source load 116 which keeps the amplifier 102 balanced at the regulated voltage.

A current source 118 and a PMOS transistor 120 is connected between BATTERY and a node 122 and insures that turn off will occur smoothly without unwanted voltage spikes. The gate of transistor 120 is connected with and controlled by the input signal DATAIN.

DATAIN is also connected to a PMOS transistor 126 through an inverter 124. A voltage source 128 comprising an NPN transistor 130, a PMOS transistor 132, and a current source 134 is shorted out by the transistor 126 when DATAIN goes high in order to minimize turn on delay at node BUS as will be explained more fully hereinafter.

A feedback voltage is applied from node 142 to the input of the amplifier 102 at the node 122 from the junction of resistors 138 and 140 which are connected with the emitter of a transistor 136 and follows the voltage at node 142. The integrating capacitor 30 is connected between the node 142 and 144. An emitter follower output stage comprising an NPN transistor 146 and a resistor 148 are also connected with the junction 142. Loss of ground protection is provided by a PMOS transistor 150 which has its gate connected to ground.

The resistor 152 and capacitor 154 connected between the node BUS and a node designated BUS GROUND, represent the load presented to the regulator bus driver 28 by the communication bus. The voltage level of BUS GROUND can be +/− 2 volts different from the ground reference for the regulator bus driver 28, and still permit accurate communications on the bus. This ground offset insensitivity exists because the exponential current from the source 26 is converted by the capacitor 30 into a voltage and imposed onto the node BUS. Since the current to voltage conversion accomplished by the capacitor 30 is only controlling the rate of change of the voltage and is insensitive to the value of the starting voltage, the voltage shaping can occur from whatever the starting voltage is on BUS GROUND.

The regulator bus driver 28 operates in the following manner with reference to the circuit of FIG. 5 and the waveforms of FIG. 6. When DATAIN transitions to a high level (FIG. 6a), the transistor 120 turns off, and the current source 118 no longer supplies current into node 122. This causes the voltage at node 122 (FIG. 6b) to drop from 10 volts to five sevenths of the voltage on node BUS as determined by the divider resistors 138 and 140. Since DATAIN has just transitioned from a low level, node BUS will be at ground, and therefore the voltage at node 122 will drop from 10 volts to 0 volts. Because the voltage at node 122 is at 0 volts the transistor 104 will turn off and the current from current source 103 will flow through transistor 106 (FIGS. 6c and 6d). Any current from transistor 104 is pulled through transistor 108 which establishes the voltage at the gate of transistor 110 which determines the amount of current which will flow out of transistor 110. Thus, the current flow in transistor 110 is equal to the current flow in transistor 104 and is also zero at this time.

With DATAIN high the gate of transistor 126 is low and this transistor conducts shunting the path through transistors 130 and 132. Since there is no current flow out of transistor 110, all of the current from current source 103 flows through transistors 114 and 150, capacitor 30, transistor 126, and transistor 106, as indicated in FIG. 6f, causing the voltage across the capacitor 30 to increase.

Because node 112 is a high gain node, a small change in the voltage at node 112 causes a big increase in current into node 142, and the node 142 has high current gain into node BUS. When the voltage across capacitor 30 changes, the voltage change occurs at node 142 and, because of the emitter follower configuration, also occurs at node BUS as shown in FIG. 6g. The rate of change of the voltage (dV/dt) at node BUS is determined by the ratio of the current source 103 to the capacitor 30.

Figure 6:
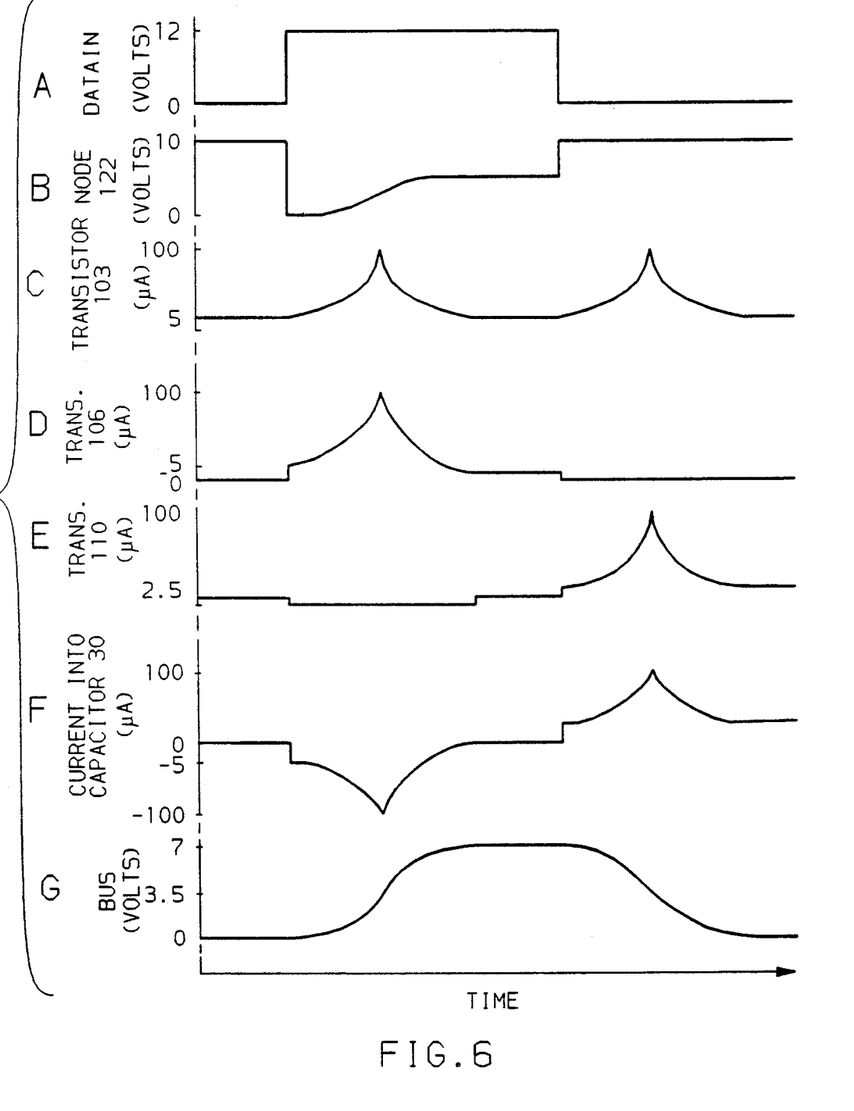
FIG. 6 shows various waveforms that are helpful in understanding the regulator bus driver of FIG. 5.

The voltage on node BUS continues to increase as indicated in FIG. 6g, until it reaches a value of 7 volts. When the voltage on node BUS reaches 7 volts, the voltage at node 122 reaches 5 volts which is equal to the value of the voltage at node REF. Under this condition the input transistors 104 and 106 are balanced and the circuit 28 acts as a voltage regulator holding the voltage at node BUS at a constant value of 7 volts. Thus, the capacitor 30 performs the dual function of both integrating the rising and falling edges and stabilizing the regulated voltage.

When DATAIN transitions to a low level, the transistor 120 turns on allowing current source 118 to flow into node 122 which creates a voltage of 10 volts. This high voltage value at node 122 causes transistor 104 to conduct all of the current from current source 103(FIG. 6e). With DATAIN low, transistor 126 is off and thus permits current to flow through transistors 130 and 132.

The current from transistor 104 is reflected to transistor 110 by transistor 108. Transistor 106 is not conducting any current because the voltage at node 122 is much higher than the voltage at node REF. Since there is no current flow in transistor 106, the current from current source 103 is sourced from transistor 110. Thus current is sourced into capacitor 30 from transistor 110 through transistors 130 and 132 (FIG. 6f). This causes the voltage at node BUS to decrease at a rate determined by the ratio of the current source 103 to the capacitor 30.

As previously indicated turn on delay of the output transistor 146 is minimized by placing the voltage source 128 in series with the integrating capacitor 30 when DATAIN goes to a low state and short circuiting this voltage source when DATAIN goes to a high state. The voltage source 128 is created by pulling a current from source 134 through diode connected transistors 130 and 132. The value of the voltage source 128 equals the voltage required to turn on the output transistor 146. The output can turn on when the base of the transistor 146 is a VBE higher than BUS, and the gate of the transistor 114 is a threshold voltage (VTH) lower than BATTERY. While DATAIN is low, transistor 126 is off and the voltage across the capacitor 30 is equal to the voltage at node 112 minus the voltage at node 142 minus the voltage across the voltage source 128. The voltage on node 112 equals the supply voltage BATTERY, the voltage on node 142 equals BUS, and the voltage across the voltage source 128 equals a VBE plus a VTH.

When DATAIN goes high, the transistor 126 is turned on and the voltage source 128 is shorted out. The voltage across the capacitor 30 can not change instantly, therefore the voltage between node 112 and node 142 is equal to BATTERY minus BUS minus a VBE minus a VTH. This makes the voltage at node 112 equal to BATTERY minus a VTH, and the voltage at node 142 equal to BUS plus a VBE. The voltage on node 112 causes transistor 114 to be turned on, and the voltage on node 142 causes transistor 146 to be turned on. This permits the voltage at node BUS to start changing with minimal delay.

As previously indicated the voltage at node BUS is being regulated and accordingly the circuit has no turn off delay. Because of the regulation, the transistor 114 is turned on just enough to provide the base drive to the transistor 146 necessary to meet the load requirements. When DATAIN goes low, the current source 118 is dumped into node 122 causing the voltage on node 122 to rise. This causes transistor 104 to conduct more current than transistor 106. Since the current in transistor 104 is reflected to transistor 110 by transistor 108, the increased current conduction in transistor 104 causes the voltage on node 112 to increase. Because transistor 114 was turned on just enough to hold node BUS at the desired voltage, when the voltage on node 112 increases, the transistor 114 can no longer provide enough base drive to transistor 146 to keep the voltage at node BUS at the regulated value. Therefore the voltage on node BUS immediately starts to fall, when DATAIN goes low.

The embodiments of the invention in which an exclusive property or privilege is claimed are defined as follows:

1. A waveshaping circuit for producing a bus output voltage signal having a substantially sinusoidal rising transition from a low voltage level to a high voltage level in response to the rising edge of a data input signal, and a substantially sinusoidal falling transition from said high voltage level to said low voltage level, in response to the falling edge of said data input signal, comprising:
   integrator means providing said bus output voltage signal,
   exponential current source means providing an exponentially increasing output current to said integrator means in response to a rising or falling edge of said data input signal and providing an exponentially decreasing output current to said integrator means in response to said bus output voltage signal exceeding a predetermined value while said data input is high or in response to said bus output voltage dropping below said predetermined value while said data input is low.

2. The invention defined in claim 1 wherein said predetermined voltage is midway between said high and low voltage levels.

3. A waveshaping circuit for producing a bus output voltage signal having a substantially sinusoidal rising transition from a low voltage level to a high voltage level in response to the rising edge of a data input signal, and a substantially sinusoidal falling transition from said high voltage level to said low voltage level, in response to the falling edge of said data input signal, comprising:
   integrator means providing said bus output voltage signal,
   exponential current source means providing an exponentially increasing output current in response to said rising or falling edge of said data input signal and providing an exponentially decreasing output current when said bus output voltage signal exceeds a predetermined value while said data input is high or said bus output voltage signal drops below said predetermined value while said data input is low,
   bus driver means for supplying said output current of said exponential current source means to said integrator means.

4. The circuit of claim 3 wherein said predetermined value is midway between said high and low voltage levels.

5. The circuit of claim 4 further comprising logic means responsive to said data input signal and said bus output signal for producing a first logic level input signal on the rising and falling edges of said data input signal, and for producing a second logic level signal when said bus output signal exceeds said predetermined value while said data input signal is at said high voltage level or when said bus output signal falls below said predetermined value while said data input signal is at said low voltage level,
   means providing a first relatively high current level in response to said rising and falling edges of said data input signal and a second relatively low current level when said bus output voltage signal exceeds a predetermined value while said data input is high or said bus output voltage signal drops below said predetermined value while said data input is low,
   said exponential current source comprising means producing first and second voltage levels in response to said first and second current levels, operational amplifier means producing a linearly increasing voltage in response to the application of said first voltage level, and a linearly decreasing voltage in response to the application of said second voltage level, a linear to exponential converter for producing an exponentially increasing current in response to said linearly increasing voltage and producing an exponentially decreasing current in response to said linearly decreasing voltage,
   said bus driver means comprising differential amplifier means having a reference node connected with a reference voltage and a feedback node responsive to said output bus voltage signal and said data input signal, said amplifier means responsive to the output of said exponential current source to provide a charging current to said integrator means in response to the rising edge of said data input signal and to provide a discharging current to said integrator means in response to said falling edge of said data input signal, output transistor means for applying the voltage across said integrator means to an output node, said amplifier means regulating the voltage at said output node at a value related to said reference voltage.

6. The invention defined in claim 5 wherein said bus driver means further comprises a voltage source equal to the value required to turn on said output transistor means, and switch means in parallel with said voltage source and responsive to said data input signal for placing said voltage source in series with said integrating capacitor when said data input signal goes to a low state and shunting said voltage source when said data input signal goes to a high state.

7. A current source providing an exponentially increasing output current in response to a first relatively high input current level and providing an exponentially decreasing output current in response to a second relatively low input current level, comprising a controlled slew rate operational amplifier having an input node and an output node, means converting said input current levels to voltage levels at said input node, said amplifier producing a linearly increasing output voltage in response to said first current level and a linearly decreasing output voltage in response to said second current level, linear to exponential converter means for converting said linearly increasing output voltage to an exponentially increasing current and said linearly decreasing output voltage to an exponentially decreasing current.

8. The current source of claim 7 wherein said controlled slew rate operational amplifier comprises a first stage including first and second input transistors having emitter, base and collector electrodes, first and second load transistors connected with the collector electrodes of said first and second input transistors respectively, said input node connected to the base electrode of said first input transistor, and a current source connected with the emitter electrodes of each of said first and second transistors, a second stage connected with said first stage and comprising a drive transistor connected with a current source load, and a capacitor and a zero cancelling resistor connected between the collector of said first input transistor and the base of said second input transistor.

9. A combination regulator bus driver circuit for producing a bus output signal having substantially sinusoidal rising transition from a low voltage level to a high voltage level in response to the rising edge of a data input signal, and a substantially sinusoidal falling transition from said high voltage level to said low voltage level, in response to the falling edge of said data input signal, comprising:
   integrator means,
   a differential amplifier means having a reference node connected with a reference voltage and a feedback node responsive to said bus output signal and said data input signal, said amplifier means providing an exponentially increasing charging current to said integrator means in response to the rising edge of said data input signal until said bus output signal reaches a voltage level midway between said low voltage level and said high voltage level, and providing an exponentially decreasing charging current to said integrator means between said midway voltage level and said high voltage level, and thereafter regulating said bus output signal at said high voltage level, said amplifier means providing an exponentially increasing discharging current to said integrator means in response to the falling edge of said data input signal until said bus output signal falls to said midway voltage level and providing an exponentially decreasing discharging current to said integrator means until said bus output signal reaches said lower voltage level.

10. A waveshaping circuit for producing a bus output voltage signal which is insensitive to ground offset between a plurality of nodes of a communications bus comprising, current source means for generating an exponential current, integrator means, means coupling said integrator means to said communications bus, bus driver means responsive to a data input signal for supplying said exponential current to said integrator means whereby said exponential current is converted to a voltage on said communication bus.

11. A waveshaping circuit for producing a bus output voltage signal which is insensitive to ground offset between a plurality of nodes of a communications bus comprising, current source means for generating an exponential current, integrator means, output transistor means coupling said integrator means to said communications bus, bus driver means responsive to a data input signal for supplying a charging current from said exponential current source to said integrator means in response to a transition of said data input signal from a first level to a second level and for supplying a discharging current from said exponential current source to said integrator means in response to a transition of said data input signal from said second level to said first level whereby said exponential current is converted to a voltage on said communication bus, said bus driver means further comprising a voltage source equal to the value required to turn on said output transistor means, and switch means in parallel with said voltage source and responsive to said data input signal for placing said voltage source in series with said integrator means when said data input signal transitions to one of said levels and shunting said voltage source when said data input signal transitions to the other of said levels.

* * * * *